United States Patent
Xu et al.

(10) Patent No.: US 11,815,823 B2
(45) Date of Patent: Nov. 14, 2023

(54) ALIGNMENT MARK FOR FRONT TO BACK SIDE ALIGNMENT AND LITHOGRAPHY FOR OPTICAL DEVICE FABRICATION

(71) Applicant: Applied Materials, Inc., Santa Clara, CA (US)

(72) Inventors: Yongan Xu, Santa Clara, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/947,841

(22) Filed: Sep. 19, 2022

(65) Prior Publication Data
US 2023/0123356 A1 Apr. 20, 2023

Related U.S. Application Data

(60) Provisional application No. 63/262,603, filed on Oct. 15, 2021.

(51) Int. Cl.
G03F 9/00 (2006.01)
G03F 7/00 (2006.01)

(52) U.S. Cl.
CPC ........ *G03F 9/7088* (2013.01); *G03F 7/70775* (2013.01)

(58) Field of Classification Search
CPC ... G03F 9/7088; G03F 9/70775; G02B 6/125; G02B 2006/12102
See application file for complete search history.

(56) References Cited

U.S. PATENT DOCUMENTS

| 5,966,201 | A | 10/1999 | Shiraishi et al. |
| 7,880,880 | B2 | 2/2011 | Van Bilsen et al. |
| 8,674,524 | B1* | 3/2014 | Woerz .......... H01L 23/544 257/797 |
| 2006/0086910 | A1* | 4/2006 | Maria Van Bilsen ........ G03F 9/7088 250/548 |
| 2008/0272282 | A1 | 11/2008 | Blauvelt et al. |
| 2009/0128792 | A1* | 5/2009 | Pellens ............ G03F 9/7084 355/53 |

FOREIGN PATENT DOCUMENTS

| KR | 2017-0103693 A | 9/2017 |
| KR | 2020-0003193 A | 1/2020 |

OTHER PUBLICATIONS

PCT/US2022/044015, International Search Report and Written Opinion dated Jan. 10, 2023, 12 pages.

* cited by examiner

*Primary Examiner* — Peter B Kim
(74) *Attorney, Agent, or Firm* — PATTERSON & SHERIDAN, LLP

(57) ABSTRACT

A method for aligning a substrate for fabrication of an optical device is disclosed that includes receiving a substrate having a first side and a second side opposite the first side, the first side of the substrate being oriented towards a scanner, the substrate having an alignment mark formed on the first side of the substrate, scanning the alignment mark with the scanner, and fabricating a first pattern for a first optical device on the first side of the substrate. The method includes positioning the substrate such that the second side is oriented toward the scanner, scanning the alignment mark on the first side with the scanner, through the second side, and fabricating a second pattern for a fourth optical device on the second side of the substrate.

17 Claims, 6 Drawing Sheets

ALIGNMENT MARK FOR FRONT TO BACK SIDE ALIGNMENT AND LITHOGRAPHY FOR OPTICAL DEVICE FABRICATION

CROSS-REFERENCE TO RELATED APPLICATIONS

This application claims priority to U.S. Provisional Patent Application Ser. No. 63/262,603, filed on Oct. 15, 2021, which is herein incorporated by reference.

BACKGROUND

Field

Embodiments of the present disclosure generally relate to optical device fabrication, and in particular to alignment marks to enable patterning of multiple optical structures.

Description of the Related Art

Virtual reality is generally considered a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated to appear as part of the environment. Augmented reality can include any type of input, such as audio and haptic inputs, as well as virtual images, graphics, and video that enhance or augment the environment that the user experiences. As an emerging technology, there are many challenges and design constraints with augmented reality.

One such challenge is displaying a virtual image overlaid on a real or virtual ambient environment. Optical devices including waveguide combiners, such as augmented reality waveguide combiners, and flat optical devices, such as metasurfaces, gratings, diffractive optical elements, and other types of optical devices and lens types, are used to assist in overlaying images. In many examples, compound optical devices made up of multiple optical devices types are positioned as groups to provide the needed optical properties. For example, an incoupling lens provides a light signal to one or more additional optical devices, the output of which is provided to an outcoupling lens. Generated light is propagated through an optical device, or compound optical device, until the light exits the optical device and is overlaid on the ambient environment.

One or more compound optical devices that make up an AR or VR device are larger than a photomask size, requiring a lithography stitching processes to combine multiple optical devices to form a single compound optical device. As stitching accuracy needs to be high, the movements of a substrate needed to pattern different optical devices, such as rotational movement of the substrate and inversion of the substrate to pattern optical devices on a reverse side, are a significant challenge for conventional approaches.

Accordingly, what is needed are systems and methods for overcoming the challenges of conventional approaches.

SUMMARY

According to one embodiments an optical device substrate is disclosed that includes the optical device substrate including a first side and a second side opposite the first side, two or more compound optical devices, each compound optical device having a first side and a second side opposite the first side, at least the first side of the compound optical device having an optical device pattern disposed thereover. The optical device substrate further includes a first alignment mark deposited on the first side of the substrate oriented in a first direction, the first alignment mark comprising a first plurality of parallel alignment bars separated at a first pitch, each bar of the first plurality of parallel alignment bars being segmented into at least two bars.

According to another embodiment, a method for aligning a substrate for fabrication of an optical device that includes receiving a substrate having a first side and a second side opposite the first side, the first side of the substrate being oriented towards a scanner, the substrate having an alignment mark formed on the first side of the substrate, scanning the alignment mark with the scanner, and fabricating a first pattern for a first optical device on the first side of the substrate. The method includes positioning the substrate such that the second side is oriented toward the scanner, scanning the alignment mark on the first side with the scanner, through the second side, and fabricating a second pattern for a fourth optical device on the second side of the substrate.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
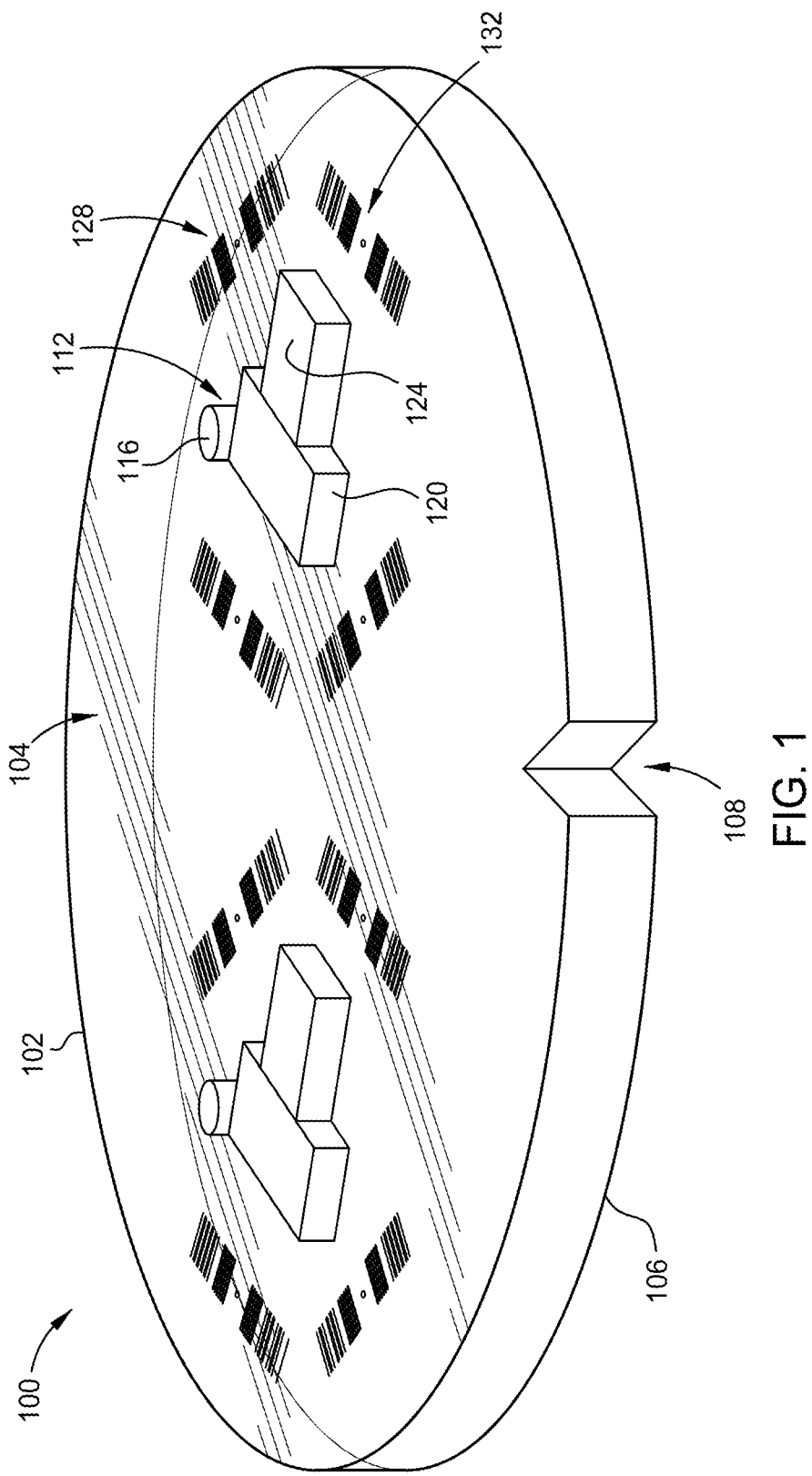
FIG. 1 depicts an optical device substrate, according to certain embodiments.

In the following, reference is made to embodiments of the disclosure. However, it should be understood that the disclosure is not limited to specific described embodiments.

Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

A compound optical component for AR/VR and other applications may have an optical component made up of two or more individual optical elements including incouplers, outcouplers, gratings, waveguides, diffractive optical elements and others. However, conventionally, such a compound optical device is typically larger than one photomask size. As a result, in order to develop a typical compound optical component (COE) a substrate will need to be rotated to pattern at least one of the optical elements. In embodiments having elements of the compound optical element on the both sides of the substrate, the substrate will need to be inverted. In some embodiments, the substrate will need to be rotated and inverted, possibly multiple times, in order to pattern a complete compound optical element.

Conventionally, alignment marks are read by a scanner and used to position photolithography systems to pattern one or more masks on the substrate to develop the compound optical element. However, conventional alignment marks may be difficult for a scanner to read. Conventionally, in embodiments where a substrate is inverted to further develop a compound optical element, alignment marks are deposited on both sides of the substrate, adding further precision and accuracy challenges in aligning alignment marks on both sides of the substrate.

According to embodiments disclosed herein, alignment marks are deposited on a single side of the substrate, and one or more individual bars of an alignment mark are segmented into multiple bars. By segmenting individual bars of an alignment mark, the resulting individual bar is more highly reflective and are read more predictably and accurately by a scanner of a photolithography system. The segmented bars are parallel, either running in the lengthwise direction of the individual bar they make up, running at an angle greater than 0 degrees and less than 180 degrees, or running across the width of the individual bar.

FIG. 1 depicts an optical device substrate 100, according to certain embodiments. Optical device substrate 100 includes a substrate 102 that has a first side 104 and a second side 106. The first side 104 and second side 106 are made up on one or more optically transparent materials, such as silicon (Si), silicon dioxide (SiO$_2$), fused silica, quartz, silicon carbide (SiC), germanium (Ge), silicon germanium (SiGe), indium phosphide (InP), gallium arsenide (GaAs), gallium nitride (GaN), or sapphire, or other optically transparent material. Substrate 102 includes a notch 108, that may serve as a guide for positioning the substrate in a processing tool, such as a photolithography system, an etch system, cleaning system, singulation system, or other system used in the development and fabrication of compound optical elements.

Optical device substrate 100 further includes a first compound optical device (COE) 112 on the first side 104. According to certain embodiments, the first COE 112 includes a first optical element 116, a second optical element 120, and a third optical element 124. According to certain embodiments, one or more of the first optical element 116, second optical element 120, and third optical element 124, may be comprised of smaller optical device structures, for example, optical devices of sub-micron or nano-sized dimensions. Although three optical devices are depicted making up the first COE 112, the first COE 112 may be comprised of fewer optical elements or more than three optical elements. One of skill in the art will appreciate that these optical elements, and COE, may include and are not limited to one or more waveguides, gratings, diffractive optical elements, metasurfaces, prisms, lenses, and other optical elements.

Figure 6:
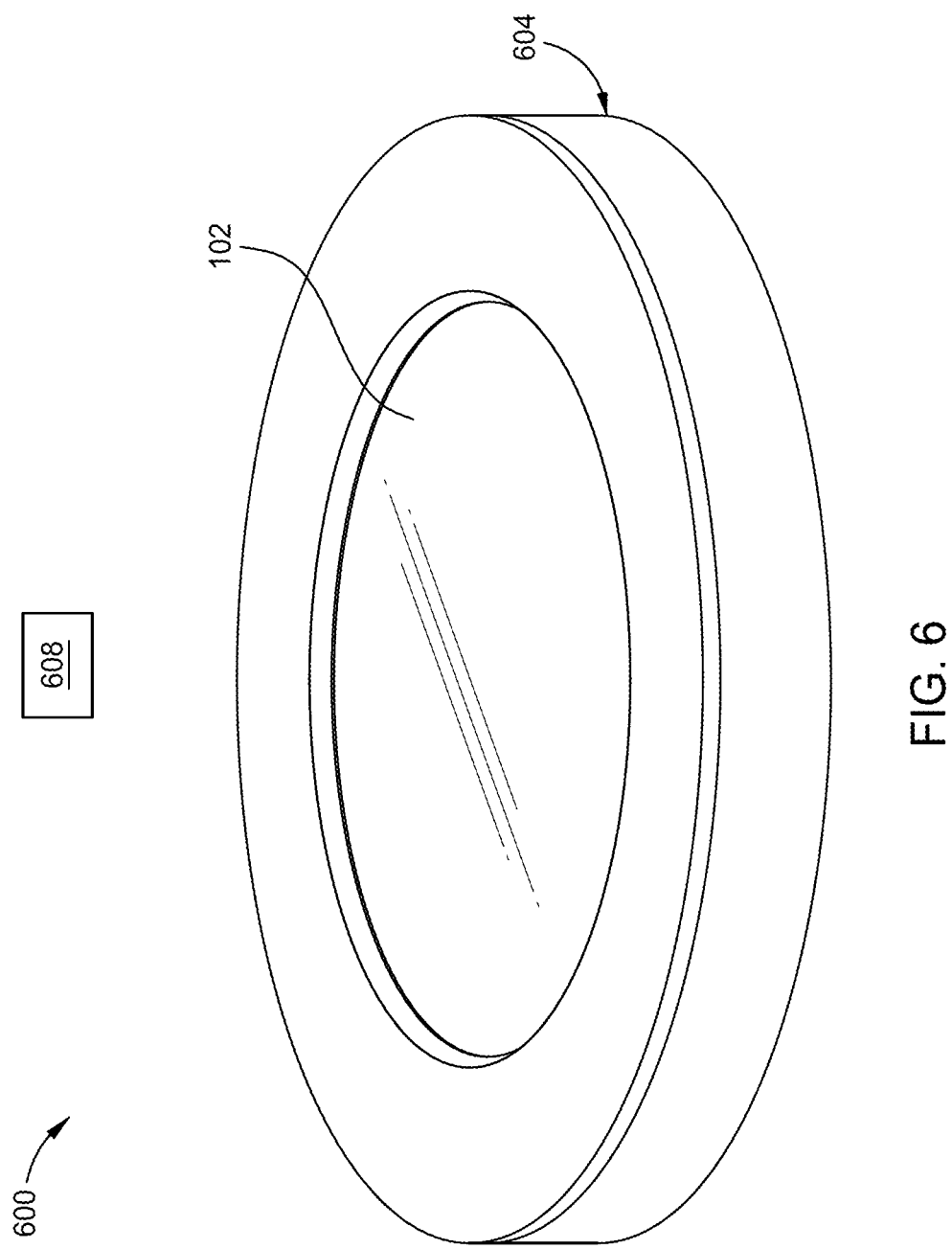
FIG. 6 depicts an example system for patterning an optical device on a substrate, according to certain embodiments.

According to certain embodiments, at least one of the optical elements is not or cannot be patterned with the same photoresist mask in a photolithography tool, indicating the use of multiple patternings. By way of example, first optical element 116 and second optical element 120 may be patterned with a first photoresist mask, or combination of photoresist masks, while the third optical element 124 is patterned with a second photoresist mask. In some embodiments, in order to pattern the third optical element 124 with the second photoresist mask, the substrate 102 may be rotated in order to stitch the third optical element 124 to one or both of the first optical element 116 and second optical element 120. In some embodiments, such rotation may be 90 degrees or 270 degrees. The amount of rotation is determined by the design of the optical elements to be patterned on the substrate 102, and may be from 1 degree to 359 degrees depending on the needs of the design. After rotation of the substrate, such as by utilizing an optical substrate processing system as depicted in FIG. 6 discussed below, a scanner 608 of the optical substrate processing system orients a patterning eye by reading one or more alignment marks such as X alignment mark 128 and Y alignment mark 132 that have been patterned on the first side 104. By reading the alignment marks, the processing system may properly align patterning of the third optical element 124 to optically stitch, or couple, this element to one or both of the first optical element 116 and second optical element 120.

Figure 2:
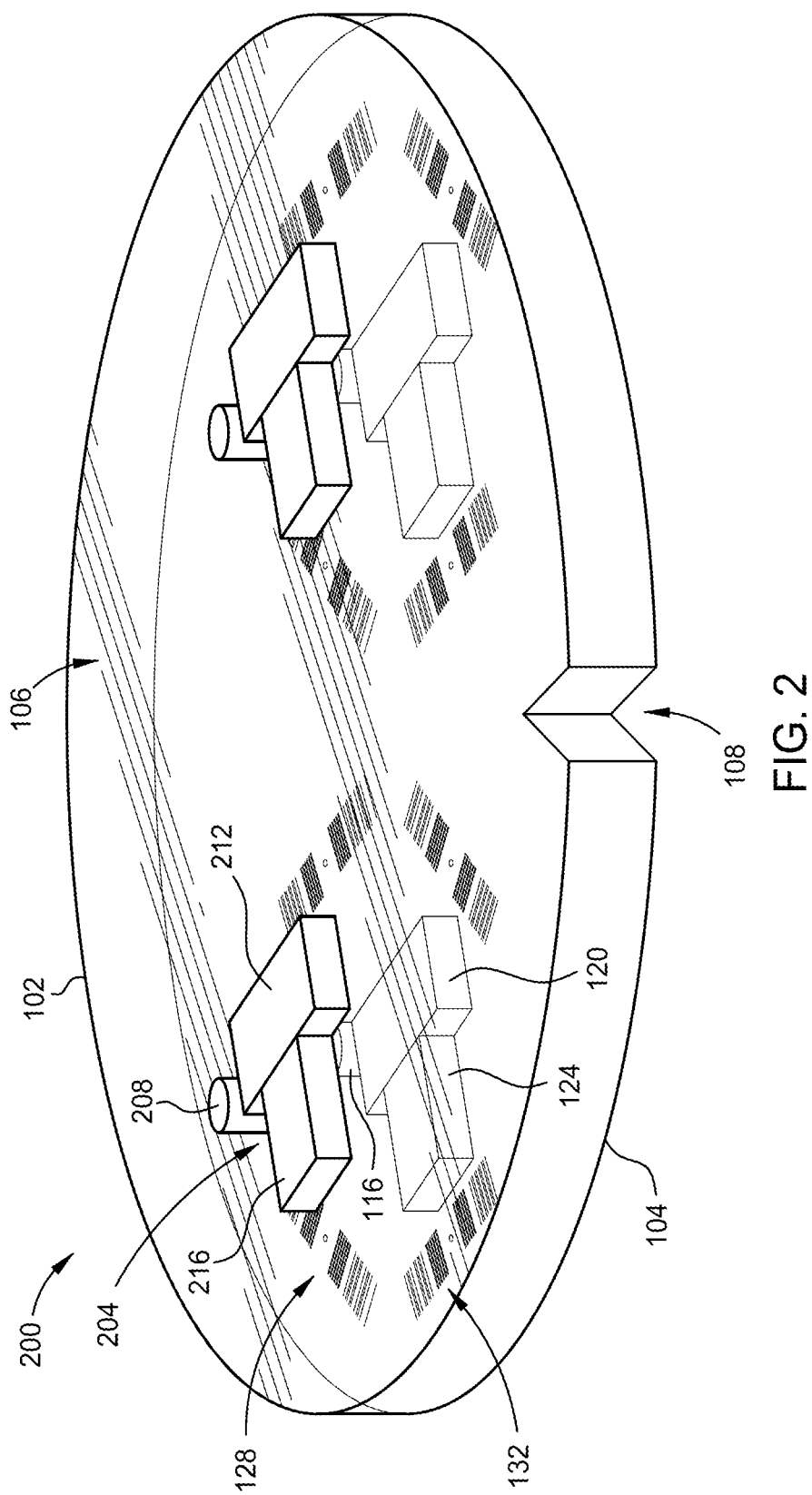
FIG. 2 depicts an optical device substrate, according to certain embodiments.

FIG. 2 depicts an optical device substrate 200 according to certain embodiments. The substrate 102 has been repositioned to place the second side 106 on top, e.g. towards the scanner 508. In addition to the elements described above in connection with FIG. 1, the optical device substrate 200 includes a second COE 204 formed on the second side 106. According to certain embodiments, the second COE 204 incudes a fourth optical element 208, a fifth optical element 212, and a sixth optical element 216. According to certain embodiments, one or more of the fourth optical element 208, fifth optical element 212, and sixth optical element 216, may be comprised of smaller optical device structures, for example, optical devices of sub-micron or nano-sized dimensions. According to certain embodiments, one or more elements of second COE 204 are optically coupled to one or more element of first COE 112, the combination of COE 204 and COE 112 forming a larger COE that may be singulated from the substrate 102. These optical elements, i.e., COEs and combinations of COEs, may include and are not limited to one or more waveguides, gratings, diffractive optical elements, metasurfaces, prisms, lenses, and other optical elements.

Figure 3A:
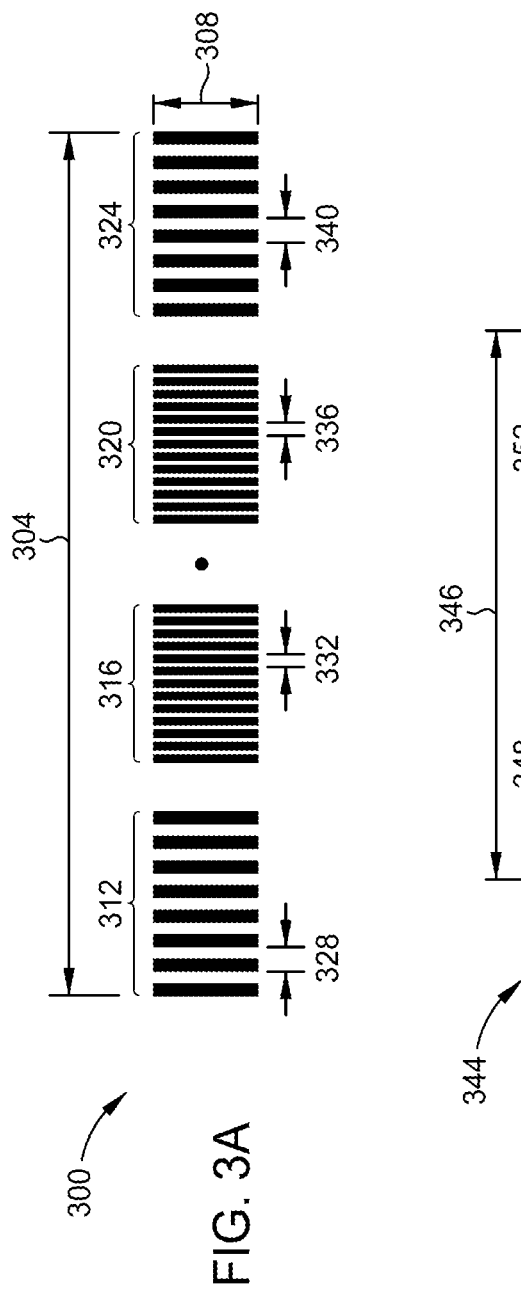
FIG. 3A depicts an alignment mark according to certain embodiments.

FIG. 3A depicts an alignment mark 300 according to certain embodiments. One or more X alignment mark 128 and Y alignment mark 132 may be comprised of alignment mark 300. Alignment mark 300 may have a length 304 from about 600 um to about 2000 um, such as 709.8 um or 710.2 um. Alignment mark 300 may have a height 308 from about 30 um to about 200 um, such as 72 um or 38 um. Alignment mark 300 includes a first alignment bar group 312 and a second alignment bar group 316 that for X alignment mark 128 designate a left side position of the X alignment mark 128, and for the Y alignment mark 132 designate a top position of the Y alignment mark 132. Alignment mark 300 includes a third alignment bar group 320 and a fourth alignment bar group 324, that for the X alignment mark 128 designates a right side position of the X alignment mark 128, and for the Y alignment mark 132 designates a bottom position of the Y alignment mark 132.

Each alignment bar group comprises at least two alignment bars separated by a first pitch 328, a second pitch 332, a third pitch 336, and a fourth pitch 340 respectively that may be different for each alignment bar group. For X alignment mark 128, the pitch separating alignment bars provides a data value to a processing system as to the position of the alignment bar group within the X alignment mark (e.g., left or right). For the Y alignment mark 132, the pitch separating alignment bars provides a data value to a processing system as to the position of the alignment bar group within the Y alignment mark 132 (e.g., top or bottom). Pitch distances may include for example, values ranging from 2 um to 18 um, such as 2.3 um, 3.2 um, 16 um, and 17.6 um.

Figure 3B:
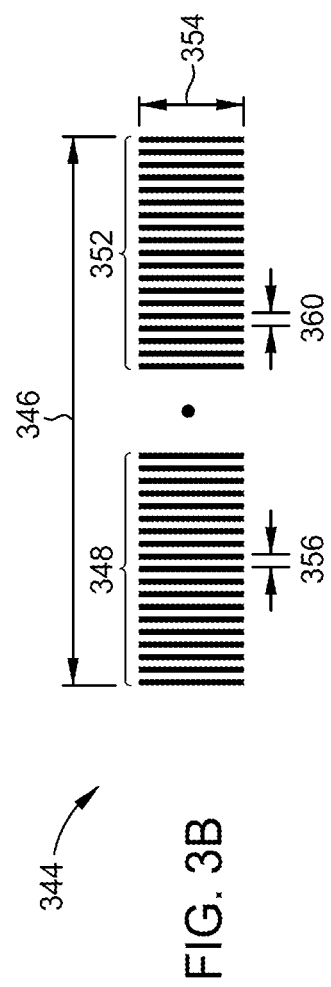
FIG. 3B depicts an alignment mark, according to certain embodiments.

FIG. 3B depicts an alignment mark 344, according to certain embodiments. One or more X alignment mark 128 and Y alignment mark 132 may be comprised of alignment mark 344. Alignment mark 344 may have a length 346 from about 300 um to about 1000 um, such as 324.2 um, 324.25 um, 324.6 um, 726.6 um, or 727 um. Alignment mark 344 may have a height 354 from about 30 um to about 200 um, such as 72 um or 38 um. Alignment mark 344 includes a first alignment bar group 348 for X alignment mark 128 designate a left side position of the X alignment mark 128, and for the Y alignment mark 132 designate a top position of the Y alignment mark 132. Alignment mark 344 includes a second alignment bar group 352, that for the X alignment mark 128 designates a right side position of the X alignment mark 128, and for the Y alignment mark 132 designates a bottom position of the Y alignment mark 132.

Each alignment bar group comprises at least two alignment bars separated by a first pitch 356, and a second pitch 360 respectively that may be different for each alignment bar group. For X alignment mark 128, the pitch separating alignment bars provides a data value to a processing system as to the position of the alignment bar group within the X alignment mark (e.g., left or right). For the Y alignment mark 132, the pitch separating alignment bars provides a data value to a processing system as to the position of the alignment bar group within the Y alignment mark 132 (e.g., top or bottom). Pitch distances may include for example, values ranging from 2 um to 18 um, such as 2.3 um, 3.2 um, 16 um, and 17.6 um.

Figure 3C:
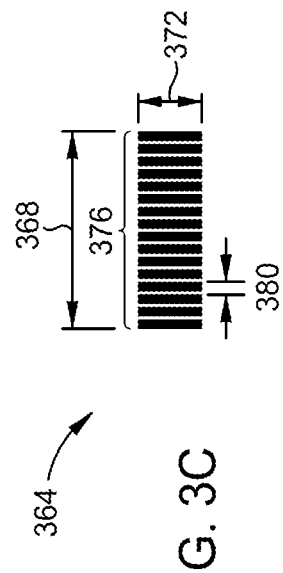
FIG. 3C depicts an alignment mark, according to certain embodiments.

FIG. 3C depicts an alignment mark 364, according to certain embodiments. One or more X alignment mark 128 and Y alignment mark 132 may be comprised of alignment mark 364. Alignment mark 364 may have a length 368 from about 300 um to about 1000 um, such as 324.2 um, 324.25 um, 324.6 um, 726.6 um, or 727 um. Alignment mark 364 may have a height 372 from about 30 um to about 200 um, such as 72 um or 38 um. Alignment mark 364 includes a first alignment bar group 376 that for X alignment mark 128 designates a position of the X alignment mark 128, and utilizing an alignment bar such as first alignment bar group 376 that for the Y alignment mark 132 designates a position of the Y alignment mark 132.

Each alignment bar group comprises at least two alignment bars separated by a first pitch 380. For X alignment mark 128, the pitch separating alignment bars provides a data value to a processing system as to the position of the alignment bar group within the X alignment mark (e.g., left or right). For the Y alignment mark 132, the pitch separating alignment bars provides a data value to a processing system as to the position of the alignment bar group within the Y alignment mark 132 (e.g., top or bottom). Pitch distances may include for example, values ranging from 2 um to 18 um, such as 2.3 um, 3.2 um, 16 um, and 17.6 um.

Figure 4A:
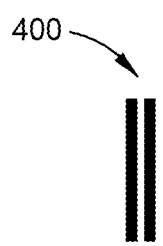
FIG. 4A-4D depict a segmented bars, according to certain embodiments.
Figure 4B:
Figure 4C:
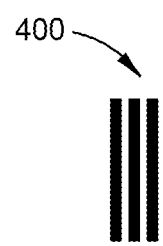
Figure 4D:
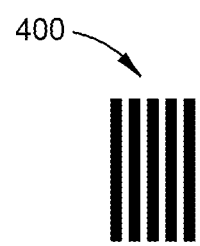
Figure 5:
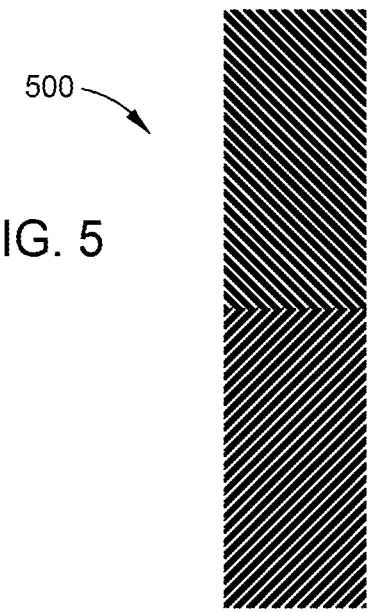
FIG. 5 depicts a segmented bar, according to certain embodiments.

According to certain embodiments, at least one alignment bar of at least one alignment bar group is a segmented bar made up of multiple bar segments. FIGS. 4A-4D depict example embodiments of a segmented bar, according to certain embodiments. FIG. 4A depicts a segmented bar 400 that is comprised of at least two bars that make up an alignment bar, the at least two bars being parallel to each other and oriented in a direction that is parallel to the alignment bar and set apart at a pitch ranging from 1 um to 4 um. FIG. 4B depicts a segmented bar 400 that is comprised of at least three bars that make up an alignment bar, the at least three bars being parallel to each other and oriented in a direction that is parallel to the alignment bar and set apart at a pitch ranging from 1 um to 4 um. FIG. 4C depicts a segmented bar 400 that is comprised of at least four bars that make up an alignment bar, the at least four bars being parallel to each other and oriented in a direction that is parallel to the alignment bar and set apart at a pitch ranging from 1 um to 4 um. FIG. 4D depicts a segmented bar 400 that is comprised of at least five bars that make up an alignment bar, the at least five bars being parallel to each other and oriented in a direction that is parallel to the alignment bar and set apart at a pitch ranging from 1 um to 4 um. FIG. 5 depicts a segmented bar 504 that is comprised of at least two bars that make up an alignment bar, the at least two bars being parallel to each other, set apart at a pitch of 1 um to 4 um, and oriented at an angle relative to the direction of the alignment bar.

FIG. 6 depicts an example system 600 for patterning an optical device on a substrate, according to certain embodiments. The system 600 is configured to retain a substrate 102. The system 600 includes a stage 604 for holding a substrate and a scanner 608 for detecting and identifying one or more alignment marks (e.g., X alignment mark 128 or Y alignment mark 132) on the substrate 102. The system 600 is operable to direct light to the substrate 102, for example from the scanner 608 capable of reading alignment marks such as X alignment mark 128 and Y alignment mark 132. The light propagates through the substrate 102 via total internal reflection (TIR). The light illuminates the substrate 102 such that the one or more alignment marks may be visible to the scanner 608 disposed above the system 600. Therefore, the system 600 is operable to be utilized for detection and identification of alignment marks on first side 104 the substrate 102 when the first side is facing the scanner 608. The system is additionally operable to be utilized for detection and identification of alignment marks on the first side 104 of the substrate 102 when the second side 106 is facing the scanner 608.

The system 600 may be positioned in an in-line processing station. Thus, alignment marks positioned on one or more substrates 102 may be detected and identified individually. For example, the alignment marks on one or more substrates 102 may be detected and identified at multiple stages of the manufacturing process as needed, such as between process steps, such as after rotation or inversion of the substrate 102. The system 600 may be disposed on manufacturing equipment utilized during the manufacturing process.

Figure 7:
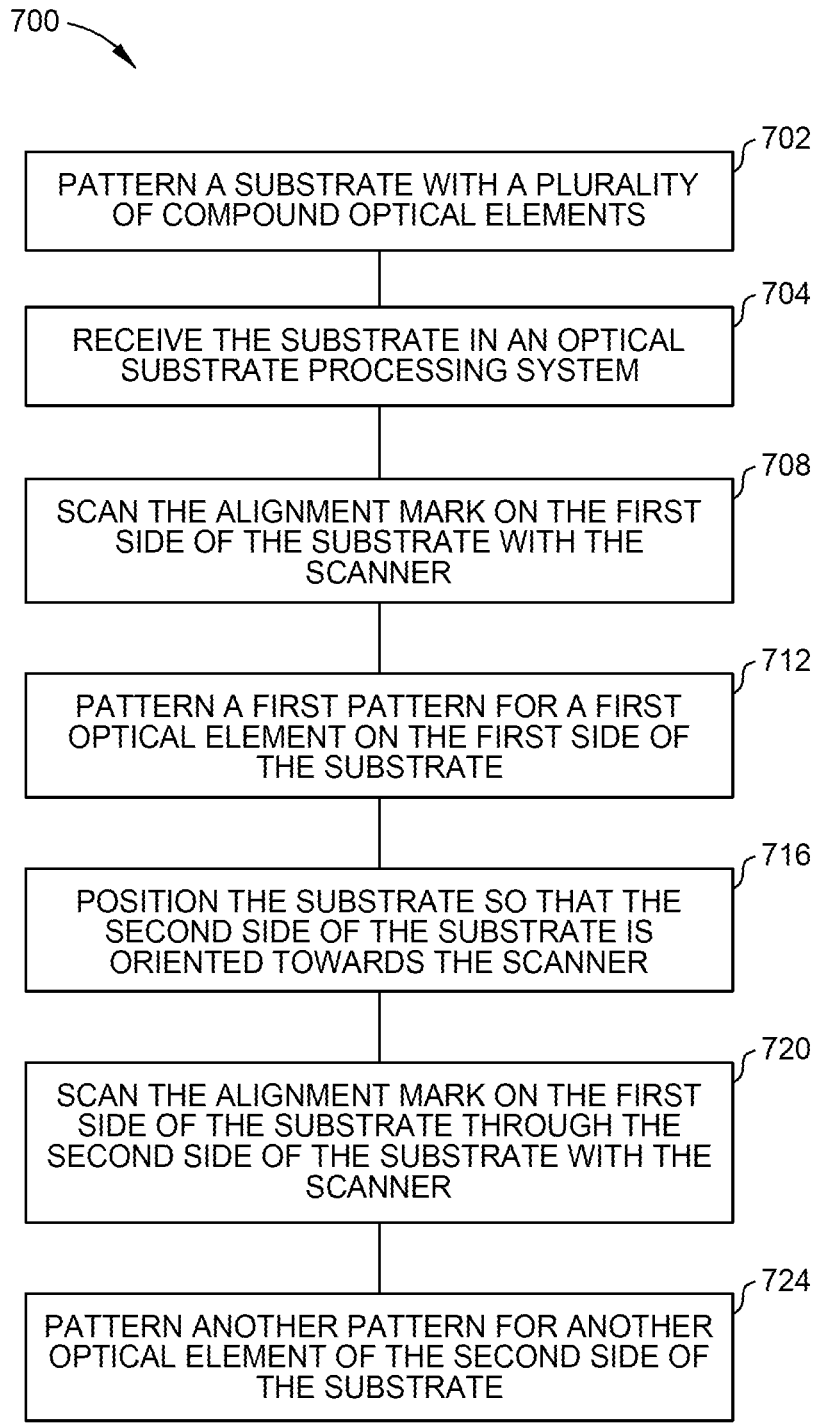
FIG. 7 depicts an example method, according to certain embodiments.

FIG. 7 depicts an example method 700, according to certain embodiments. At operation 702, a substrate 102 is patterned with a plurality of compound optical elements (COEs). The substrate 102 further includes a first side 104 and a second side 106 opposite the first side 104. Each of the first side 104 and second side 106 has a plurality of the COEs, e.g., a first COE 112 on the first side 104 and a second COE 204 on the second side 106. Each COE has a plurality of optical elements, i.e., a first optical element 116, a second optical element 120, and a third optical element 124 on the first COE 112 and a fourth optical element 208, a fifth optical element 212 and a sixth optical element 216 on the second COE 204.

At operation 704, system 600 receives the substrate 102. The first side 104 of the substrate 102 is oriented towards a scanner 608. The substrate 102 has an alignment mark, e.g., one of X alignment mark 128 or Y alignment mark 132 formed on the first side 104 of the substrate 102. The X alignment mark 128 and the Y alignment mark 132 are formed of alignment marks e.g., alignment mark 300, alignment mark 128, alignment mark 132, or a combination thereof.

At operation 708, the scanner 608 scans the X alignment mark 128 and the Y alignment mark 132. The X and Y alignment marks 128, 132 may have a length from about 300 um to about 2000 um, such as about 300 um to about 1000 um, or about 600 um to about 2000 um, or such as 709.8 um or 710.2 um. The X and Y alignment marks 128, 132 may have a height from about 30 um to about 200 um, such as 72 um or 38 um. The X and Y alignment marks 128, 132 include an alignment bar group that designates a position for the scanner 608 to scan. The scanner 608 scans the X and Y alignment marks 128, 132 to align the photomask to the first COE 112.

At operation 712, a first pattern for first optical element 116 is fabricated on the first side 104 of the substrate 102. Additionally or alternatively, a second pattern for a second optical element 120 is fabricated on the first side 104 of the substrate 102. At an optional operation, the substrate 102 is rotated and a third pattern for a third optical element 124 is fabricated on the first side of the substrate 102. The scanner 608 scans the alignment mark 300 before fabricating the third pattern on the third optical element 124 to ensure that the third pattern is stitched (e.g., aligned) with the first pattern and the second pattern.

At operation 716, the substrate 102 is positioned such that the second side 106 is oriented toward the scanner 608.

At operation 720, the scanner 608 scans the alignment mark on the first side 104 with the scanner 608, through the second side 106. The scanner 608 scans the alignment mark 300 to align the photomask to the second COE 204

At operation 724, another pattern (e.g., a fourth pattern) is fabricated for the fourth optical element 208 on the second side 106 of the substrate 102. In another embodiment, a fifth pattern is fabricated for the fifth optical element 212 on the second side 106 of the substrate 102. The fourth pattern and fifth pattern on the second side 106 of the substrate 102 align with the first pattern and the second pattern on the first side 104 of the substrate 102.

At an optional operation, the substrate 102 is rotated and a sixth pattern for a sixth optical element 216 is fabricated on the second side of the substrate 102. The scanner 608 scans the alignment mark 300 before fabricating the sixth pattern on the sixth optical element 216 to ensure that the sixth pattern is stitched (e.g., aligned) with the fourth pattern and the fifth pattern. The sixth pattern on the second side 106 of the substrate 102 aligns with the third pattern of the first side 104 of the substrate 102.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. In addition, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

While the foregoing is directed to embodiments of the present disclosure, other and further embodiments of the disclosure may be devised without departing from the basic scope thereof, and the scope thereof is determined by the claims that follow.

What is claimed is:

1. An optical device substrate, comprising: a first side and a second side opposite the first side;
   two or more compound optical elements (COEs), each COE having an optical device pattern disposed thereover;
   a first alignment mark patterned on the first side of the substrate oriented in a first direction, the first alignment mark comprising a plurality of alignment bar groups comprising one or more alignment bars separated at a first pitch, wherein:
     a first alignment bar group of the plurality of alignment bar groups has a first pitch; and
     a second alignment bar group of the plurality of alignment bar groups has a second pitch;
     a third alignment bar group of the plurality of alignment bar groups has a third pitch; and
     a fourth alignment bar group of the plurality of alignment bar groups has a fourth pitch;
   wherein the first alignment bar group and the second alignment bar group indicate a left side position and a top side position of the optical device substrate, and wherein the third alignment bar group and the fourth alignment bar group indicate a right side position and a bottom side position of the optical device substrate.

2. The optical device substrate of claim 1, wherein the alignment bars of the first alignment bar group are parallel to each other, and the first alignment bar group is oriented at an angle greater than 0 degrees and less than 180 degrees relative to the second alignment bar group.

3. The optical device substrate of claim 1, wherein the first alignment mark has a length from about 300 um to about 2000 um and a height from about 30 um to about 200 um.

4. The optical device substrate of claim 1, further comprising a second alignment mark deposited the first side of the substrate oriented in a second direction, the second alignment mark comprising a second plurality of alignment bar groups comprising one or more alignment bars separated at a second pitch.

5. An optical device substrate, comprising:
a first side and a second side opposite the first side;
the first side of the optical device substrate having two or more compound optical elements (COEs), each COE having an optical device pattern disposed thereover; and
a first alignment mark patterned on the first side of the substrate oriented in a first direction, the first alignment mark comprising a plurality of alignment bar groups comprising one or more alignment bars separated at a first pitch;
the second side of the optical device substrate having one or more COEs, each COE having an optical device pattern disposed thereover; and
wherein a scanner is configured to scan the plurality of alignment bar groups of the alignment mark to align the optical pattern disposed on the compound optical elements.

6. The optical device substrate of claim 5, wherein a scanner scans the plurality of alignment bar groups of the alignment mark on the first side of the optical device substrate through the optical device substrate to align the COE on the second side of the optical device substrate to the COE on the first side of the optical device substrate.

7. A method for aligning a substrate for fabrication of an optical device, comprising:
receiving a substrate having a first side and a second side opposite the first side, the first side of the substrate being oriented towards a scanner, the substrate having an alignment mark formed on the first side of the substrate;
scanning the alignment mark with the scanner;
fabricating a first pattern for a first optical element on the first side of the substrate;
positioning the substrate such that the second side is oriented toward the scanner;
scanning the alignment mark on the first side with the scanner, through the second side; and
fabricating a second pattern for a second optical element on the second side of the substrate.

8. The method of claim 7, wherein the alignment mark comprises a first plurality of alignment bar groups, at least one alignment bar group having a first plurality of alignment bars separated at a first pitch.

9. The method of claim 8, wherein the first plurality of alignment bars are:
parallel to each alignment bar of the first plurality of alignment bars; and
oriented at an angle of greater than 0 degrees and less than 180 degrees relative to a second plurality of alignment bars, the second plurality of alignment bars separated at a second pitch.

10. The method of claim 7 further comprising
rotating the substrate after fabricating the first pattern for the first optical device; scanning the alignment mark; fabricating a third pattern for a third optical device on the first side of the substrate.

11. The method of claim 7 further comprising
rotating the substrate after fabricating the third pattern for the third optical device;
scanning the alignment mark;
fabricating a fourth pattern for a fourth optical device on the second side of the substrate.

12. A method for aligning a substrate for fabrication of an optical device, comprising:
receiving a substrate having a first side and a second side opposite the first side, the first side of the substrate being oriented towards a scanner, the substrate having an alignment mark formed on the first side of the substrate, a first compound optical element (COE) on the first side of the substrate, and a second COE, wherein the first COE has a first plurality of optical elements, and the second COE has a second plurality of optical elements;
scanning the alignment mark with the scanner;
fabricating a pattern for a first optical element of the first plurality of optical elements on the first side of the substrate;
positioning the substrate such that the second side is oriented toward the scanner;
scanning the alignment mark on the first side with the scanner, through the second side; and
fabricating a pattern for a second optical element of the second plurality of optical elements on the second side of the substrate.

13. The method of claim 12, wherein the first plurality of optical elements comprises a third optical element and a fourth optical element, the method further comprising fabricating a pattern on the second optical element after fabricating the pattern on the first optical element, rotating the substrate after fabricating the pattern on the second optical element, and fabricating a pattern on the third optical element.

14. The method of claim 12, wherein the second plurality of optical elements comprises a fifth optical element and a sixth optical element, the method further comprising fabricating a pattern on the fifth optical element after fabricating the pattern on the second optical element, rotating the substrate after fabricating the pattern on the fifth optical element, and fabricating a pattern on the sixth optical element.

15. The method of claim 14, wherein the pattern on the first optical device and the pattern on the second optical device are aligned, the pattern on the third optical device and the pattern on the fifth optical device are aligned, and the pattern on the fourth optical device and the pattern on the sixth optical device are aligned, or any combination thereof are aligned.

16. The method of claim 12, wherein the alignment mark comprises a first plurality of alignment bar groups, at least one alignment bar group having a plurality of alignment bars separated at a first pitch.

17. The method of claim 12, wherein the one or more alignment bars are:

parallel to each alignment bar of the first plurality of alignment bars; and oriented at an angle of greater than 0 degrees and less than 180 degrees relative to a second plurality of alignment bars, the second plurality of alignment bars separated at a second pitch.

\* \* \* \* \*